US007325180B2

(12) United States Patent
Pileggi et al.

(10) Patent No.: US 7,325,180 B2
(45) Date of Patent: Jan. 29, 2008

(54) SYSTEM AND METHOD TO TEST INTEGRATED CIRCUITS ON A WAFER

(75) Inventors: Lawrence Pileggi, Pittsburgh, PA (US); Chik Patrick Yue, East Palo Alto, CA (US); R. Shawn Blanton, Sewickley, PA (US); Thomas Vogels, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 380 days.

(21) Appl. No.: 10/707,205

(22) Filed: Nov. 26, 2003

(65) Prior Publication Data
US 2005/0138499 A1 Jun. 23, 2005

(51) Int. Cl.
*G01R 31/26* (2006.01)
*G01R 31/28* (2006.01)
(52) U.S. Cl. .................. 714/724; 324/765; 714/716
(58) Field of Classification Search ............ 714/733, 714/724; 455/73
See application file for complete search history.

(56) References Cited

U.S. PATENT DOCUMENTS

| | | | | |
|---|---|---|---|---|
| 3,091,734 A | * | 5/1963 | Graves ..................... | 455/77 |
| 4,609,911 A | * | 9/1986 | Nourse et al. ............ | 340/572.1 |
| 4,704,734 A | * | 11/1987 | Menich et al. ............ | 455/440 |
| 4,823,136 A | * | 4/1989 | Nathanson et al. ........ | 342/368 |
| 5,437,057 A | * | 7/1995 | Richley et al. ............ | 455/41.1 |
| 5,448,110 A | * | 9/1995 | Tuttle et al. .............. | 257/723 |
| 5,764,655 A | * | 6/1998 | Kirihata et al. ........... | 714/733 |
| 5,983,363 A | * | 11/1999 | Tuttle et al. .............. | 714/25 |
| 6,161,205 A | * | 12/2000 | Tuttle ....................... | 714/724 |
| 6,268,774 B1 | * | 7/2001 | Soumyanath ............. | 330/305 |
| 6,424,168 B1 | * | 7/2002 | Farnworth et al. ........ | 324/765 |
| 6,487,681 B1 | * | 11/2002 | Tuttle et al. .............. | 714/25 |
| 6,794,310 B1 | * | 9/2004 | Miller et al. ............. | 438/760 |

(Continued)

FOREIGN PATENT DOCUMENTS

JP     09101288 A    *    4/1997

(Continued)

OTHER PUBLICATIONS

"Testability and Yield of MMICs" by Allen, B.R. This paper appears in: Antennas and Propagation Society International Symposium, 1992 Digest. Held in Conjunction with: URSI Radio Science Meeting and Nuclear EMP Meeting., IEEE Publication Date: Jul. 18-25, 1992 On p. 1263 vol. 3 ISBN: 0-7803-0730-5 INSPEC Accession No. 4391024.*

(Continued)

*Primary Examiner*—Cynthia Britt
(74) *Attorney, Agent, or Firm*—Charles L. Moore; Moore & Van Allen, PLLC (57) ABSTRACT

A system to test integrated circuits on a wafer may include a transceiver formed on the wafer. The system may also include an antenna system couplable to the transceiver. The transceiver may be formed in one of a scribe line on the wafer, a chip on the wafer or on an otherwise unusable portion of the wafer. The antenna system maybe formed in at least one of the same scribe line as the transceiver or in at least one other scribe line formed in the wafer. Alternatively, the antenna system may include an antenna external to the wafer.

58 Claims, 6 Drawing Sheets

U.S. PATENT DOCUMENTS

| | | | |
|---|---|---|---|
| 6,812,048 B1 * | 11/2004 | Kline | 438/17 |
| 6,815,973 B1 * | 11/2004 | Conn | 324/765 |
| 2002/0160722 A1 * | 10/2002 | Terranova et al. | 455/73 |
| 2002/0196029 A1 * | 12/2002 | Schmidt | 324/500 |
| 2003/0001582 A1 * | 1/2003 | Kraz | 324/457 |

FOREIGN PATENT DOCUMENTS

| | | | |
|---|---|---|---|
| JP | 2002093675 A | * | 3/2002 |
| JP | 2004253561 A | * | 9/2004 |

OTHER PUBLICATIONS

"Measurement Challenges for on-wafer RF-SOC test" by Wai Yuen Lau This paper appears in: 27th Annual IEEE/SEMI International Electronics Manufacturing Technology Symposium, 2002. Publication Date: 2002 On pp. 353-359 ISBN: 0-7803-7301-4 INSPEC Accession No. 7492523.*

* cited by examiner

SYSTEM AND METHOD TO TEST INTEGRATED CIRCUITS ON A WAFER

BACKGROUND OF INVENTION

The present invention relates to integrated circuits, semiconductor chips and the like, and more particularly to a to a system and method to test an integrated circuit, semiconductor chip on a wafer.

Testing integrated circuits, semiconductor chips and the like at various stages of the manufacturing process can be advantageous as processing adjustments may be made or other remedial operations may be performed to realize higher yields. Capturing information regarding fluctuations and failures during the manufacturing process can have a substantial impact on the overall product cost. For some emerging forms of regular logic, back-end-of-line (BEOL) processing adjustments and changes could be made to permit substantially complete utilization of what would otherwise be partially non-functioning silicon. However, testing chips during the manufacturing process and while the chips are still part of a wafer, presents many challenges.

One means of testing chips during various stages of the manufacturing process is wafer probe testing. However, such testing is not without its limitations. Wafer probe testing is costly and limited in terms of the extent to which it may be used. During early stages of in-line manufacturing testing, the wafers must be maintained in their manufacturing environment. Additionally, wafer probe testing of all chips and collecting test data from all chips in the manufacturing environment is impractical. For end-of-line testing, the environmental issues are less of a problem, but the process is still costly. During wafer sort, probe testing is still time consuming and therefore costly and issues exist with respect to contact resistance associated with the probes which can impact overall yield.

SUMMARY OF INVENTION

In accordance with an embodiment of the present invention, a system to test integrated circuits, semiconductor chips or the like formed on a wafer may include a transceiver formed on the wafer. The system may also include an antenna system that is couplable to the transceiver. The transceiver may be formed in one of a scribe line formed on the wafer, on each of the integrated circuits or dies to be tested, on another chip or die on the wafer, or in an unusable portion of the wafer. The antenna system may be formed in at least one of the same scribe line as the transceiver, in at least one other scribe line formed in the wafer, on each of the integrated circuits or dies to be tested, on another chip or die on the wafer or on an usable portion of the wafer. The antenna or antenna system may also be external to the wafer and the transceiver may be coupled to the antenna by a wafer boat, handler or similar fixture that holds the wafer during manufacturing.

In accordance with another embodiment of the present invention, a system to test integrated circuits, semiconductor chips or the like formed on a wafer may include a plurality of transceivers. Each transceiver may be adapted to receive and transmit signals to test selected ones of a multiplicity of integrated circuits or the like formed on the wafer. Each of the transceivers may be formed at different locations on the wafer. Each transceiver may be formed in at least one of a plurality of scribe lines formed on the wafer, on each die or integrated circuit to be tested, on another die or chip on the wafer or on an unusable portion of the wafer. The system may also include a plurality of antenna systems. Each antenna system may be couplable to at least one of the plurality of transceivers. Each of the plurality of antenna systems may be formed at different locations on the wafer in at least one of the plurality of scribe lines, on a chip on the wafer or on an unusable portion of the wafer. In another embodiment of the present invention, the antenna or antenna system may be external to the wafer and the transceivers may be coupled to the antenna by a wafer boat or fixture used to hold the wafer during the manufacturing process.

In accordance with another embodiment of the present invention, a transceiver to test integrated circuits or the like formed on a wafer may include a down converter to convert a received radio frequency (RF) signal to an intermediate frequency (IF) signal. The transceiver may also include a received signal strength indicator (RSSI) and an amplifier to amplify the IF signal in response to the RSSI. The transceiver may also include a comparator to generate a data signal in response to an amplified IF signal.

In accordance with another embodiment of the present invention, a transceiver to test integrated circuits or the like formed on a wafer may include a phase/frequency detector to receive an input or reference signal. A charge pump may be provided to receive an output signal from the phase/frequency detector. A filter may filter signals in a selected frequency band from the charge pump. A voltage controlled oscillator may receive the filtered signal from the filter and a power amplifier may modulate a carrier frequency from the voltage controlled oscillator.

In accordance with another embodiment of the present invention, an antenna system to test integrated circuits or the like formed on a wafer may include a loop antenna or the like adapted to be shared by a plurality of transceivers. The antenna system may also include a plurality of differential amplifier circuits. Each differential amplifier circuit may be associated with one of the plurality of transceivers, wherein only one of the plurality of differential amplifier circuits may be active at any given time to permit the associated transceiver to receive or transmit signals.

In accordance with another embodiment of the present invention, a method of making a system to test integrated circuits or the like formed on a wafer may include forming a transceiver on the wafer. The method may also include providing an antenna system that is couplable to the transceiver. The transceiver may be formed in at least one of a scribe line formed on the wafer, on each die or integrated circuit to be tested, on another die or chip on the wafer, or on an unusable portion of the wafer. The antenna system may be formed in at least one of the same scribe line as the transceiver, in at least one other scribe line formed in the wafer, a die or chip on the wafer or an unusable portion of the wafer. In another embodiment of the present invention, the antenna or antenna system may be external to the wafer.

In accordance with another embodiment of the present invention, a method to test integrated circuits or the like formed on a wafer may include selecting at least one integrated circuit of a plurality of integrated circuits to be tested. The method may also include performing a test or self-test on the at least one selected integrated circuit and transmitting test results via a transceiver associated with the at least one selected integrated circuit.

DETAILED DESCRIPTION

The following detailed description of preferred embodiments refers to the accompanying drawings which illustrate specific embodiments of the invention. Other embodiments having different structures and operations do not depart from the scope of the present invention.

Figure 1:
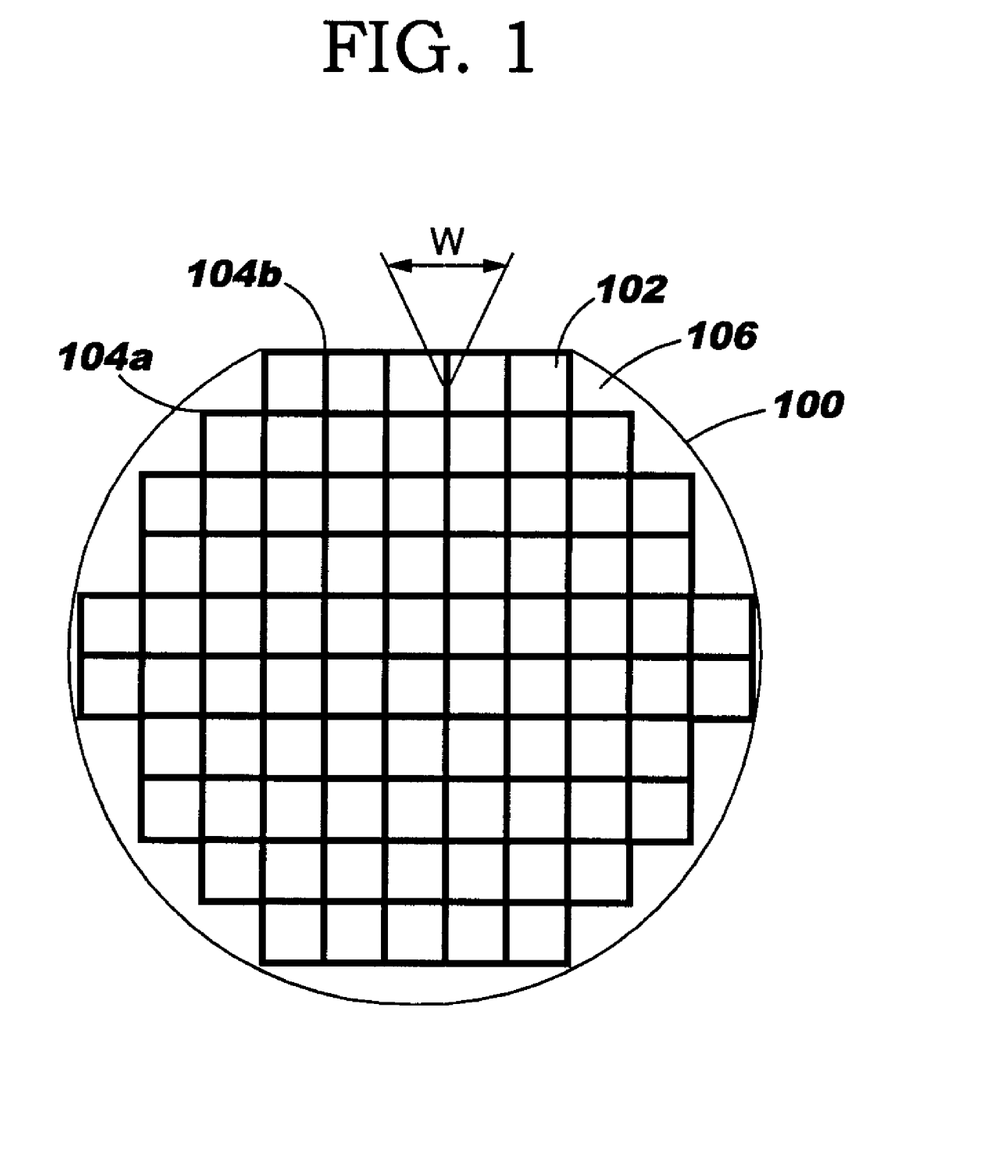
FIG. 1 is top elevation view of a wafer on which integrated circuits or the like are formed.

FIG. 1 is top elevation view of a wafer 100 on which integrated circuits 102, semiconductor chips or the like are formed. Each of the integrated circuits 102 are separated by scribe lines 104 formed in a surface of the wafer 100. A first plurality 104a of scribe lines may extend parallel to one another in one direction or substantially horizontally across the surface or the wafer 100. A second plurality 104b of scribe lines may extend substantially parallel to one another in a different direction or substantially orthogonal to the first plurality 104a of scribe lines. The scribe lines 104a and 104b may form substantially square or rectangular areas that each define an integrated circuit 102 or semiconductor chip. The scribe lines 104a and 104b may be used to separate each of the integrated circuits after fabrication. The scribe lines 104a and 104b may have a selected width "W" to permit components of a system, such as a system 200 to test integrated circuits illustrated in FIG. 2 or other systems, to be formed within the scribe lines 104a and 104b. The selected width "W" of the scribe lines may be about 200 microns or more. The system as described in more detail herein may be used to test the integrated circuits 102 on the wafer 100 at various stages during the manufacturing process. In at least one embodiment of the present invention, the system may be employed without the use of probes to test the integrated circuits 102.

Figure 2:
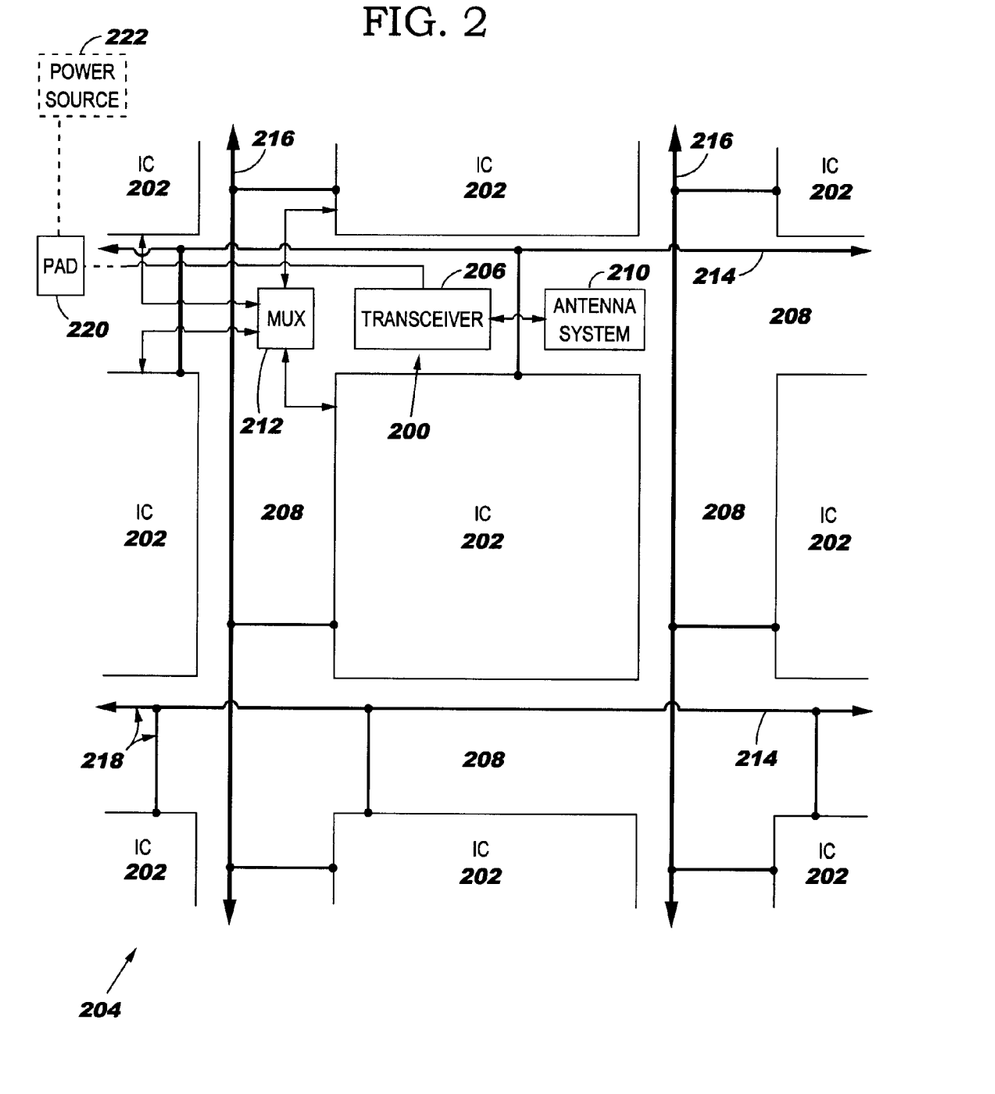
FIG. 2 is a block diagram of a system to test integrated circuits or the like formed on a wafer in accordance with an embodiment of the present invention.

FIG. 2 is a block diagram of a system 200 to test integrated circuits (ICs) 202, semiconductor chips or the like formed on a wafer 204 in accordance with an embodiment of the present invention. Only a portion of the wafer 204 and integrated circuits 202 are shown in FIG. 2 for purposes of explanation and clarity. The integrated circuits 202 and wafer 204 may be similar to the integrated circuits 102 and wafer 100 illustrated in FIG. 1. The system 200 may include a transceiver 206 formed in a scribe line 208 of the wafer 204. In other embodiments of the present invention, the transceiver 206 may be formed at other locations on the wafer 204. For example, the transceiver 204 may be formed on the die or as part of the integrated circuit 202 being tested for self-testing or the like. Alternatively, the transceiver 204 may be formed in another chip or die portion of the wafer 204 that is not used to form an integrated circuit or in an unusable portion of the wafer 204, such as the area 106 in FIG. 1. The system 200 may also include an antenna system 210 that is couplable to the transceiver 206 to receive and transmit signals to and from the transceiver 206. The antenna system 210 may also be formed in at least one scribe line 208 formed in the wafer 204 or on a surface of the wafer 204. The antenna system 210 may be formed in the same scribe line 208 as the transceiver 206, or in another embodiment, the antenna system 210 may be formed in one or more scribe lines 208 of the wafer 204. The antenna system 210 may also be formed at other locations on the wafer 204. For example, the antenna system 210 or systems may be formed on each die or chip 202 to be tested, on another chip or die portion on the wafer 204 that is not used to form an integrated circuit or on an unusable portion of the wafer 204. The antenna system 210 may include a loop antenna, a dipole antenna or the like, or the antenna system 210 may be an antenna array formed by loop elements, dipole elements or similar elements.

The transceiver 206 may be coupled to a plurality of integrated circuits 202 by a multiplexing circuit 212 or the like to test selected ones of the plurality of integrated circuits 202. The transceiver 206 may be adapted to apply test signals to at least one selected integrated circuit 202 to test the selected integrated circuit 202 in response to the antenna system 210 receiving a testing signal or a similar signal. The antenna system 210 may be adapted to receive testing signals and to transmit signals corresponding to results from the testing of the at least one selected integrated circuit 202.

In accordance with one embodiment of the present invention, an integrated circuit 202 to be tested and an associated transceiver 206 may be selected by at least one of a word-line 214 or a bit-line 216. Word-lines 214 and bit-lines 216 are electrically conductive traces of metallization or other conductive material that may be formed in the scribe lines 208. The word-lines 214 may extend in one direction across the wafer 204 and the bit-lines 216 may extend substantially orthogonal to the word-lines 214 across the wafer 204. The word-lines 214 and bit-lines 216 may be accessed proximate to a periphery or edge of the wafer 204. Each integrated circuit 202 may be electrically connected to at least one word-line 214 and to at least one bit-line 216 so that each integrated circuit 202 may be addressed by at least one associated word-line 214 and bit-line 216. The word-lines 214 and bit-lines 216 may then be used to address or select a specific integrated circuit 202 for testing or for other purposes, such as to send and receive signals from selected integrated circuits 202, powering selected integrated circuits 202 or the like. The word-lines 214 and bit-lines 216 may form a selected distribution scheme 218 or pattern in the scribe lines 208 to facilitate selecting an integrated circuit or circuits 202 to be tested and an associated transceiver or transceivers 206. The word-line/bit-line distribution scheme 218 may also be used or may be alternatively used to distribute test mode power to the selected integrated circuit 202 to be tested and the associated transceiver 206. In alternate embodiments of the present invention, the transceiver 206 may receive power via one of a probe, a radio frequency power signal or a pad 220 electrically connected to the transceiver 206 in addition to a word-line or a bit-line. The pad 220 may be formed proximate to a periphery of the wafer 204. The pad 220 may be electrically connectable to a power source 222 external to the wafer 204. Only one pad 220 is shown in FIG. 2 for purposes of explanation; however, multiple pads similar to pad 220 may be formed at selected location around the periphery of the wafer 204 to distribute power to other transceivers formed on the wafer 204.

After selecting and testing a particular integrated circuit 202 or group of integrated circuits 202, an associated transceiver 206 may be adapted to select a proper stream of test data for the particular integrated circuit 202 under test from the multiplexing circuit 212. The transceiver 206 may then transmit the resulting test data to an external transceiver or test unit (not shown in FIG. 2) via the antenna system 210. The transceiver 206 may be adapted to provide one of an amplitude shift keying (ASK) modulation scheme, on-off keying (OOK) modulation or a similar modulation scheme that may permit the architecture of the transceiver 206 to be relatively simple for formation of the transceiver 206 in the scribe line 208. The transceiver 206 may receive and transmit signals to perform real-time tests periodically during fabrication of the wafer 204, such as during burn-in stress conditions or under other environmental extremes. While only one transceiver 206 and antenna system 210 are shown in FIG. 2 for purposes of clarity and explanation, the system 200 may include a plurality of transceivers 206 and antenna systems 210 similar to the system 300 illustrated in FIG. 3. The transceivers 206 and antenna systems 210 may be located at selected locations or in a predetermined distribution to efficiently permit testing of any and all integrated circuits 202 formed on the wafer 204.

Figure 3:
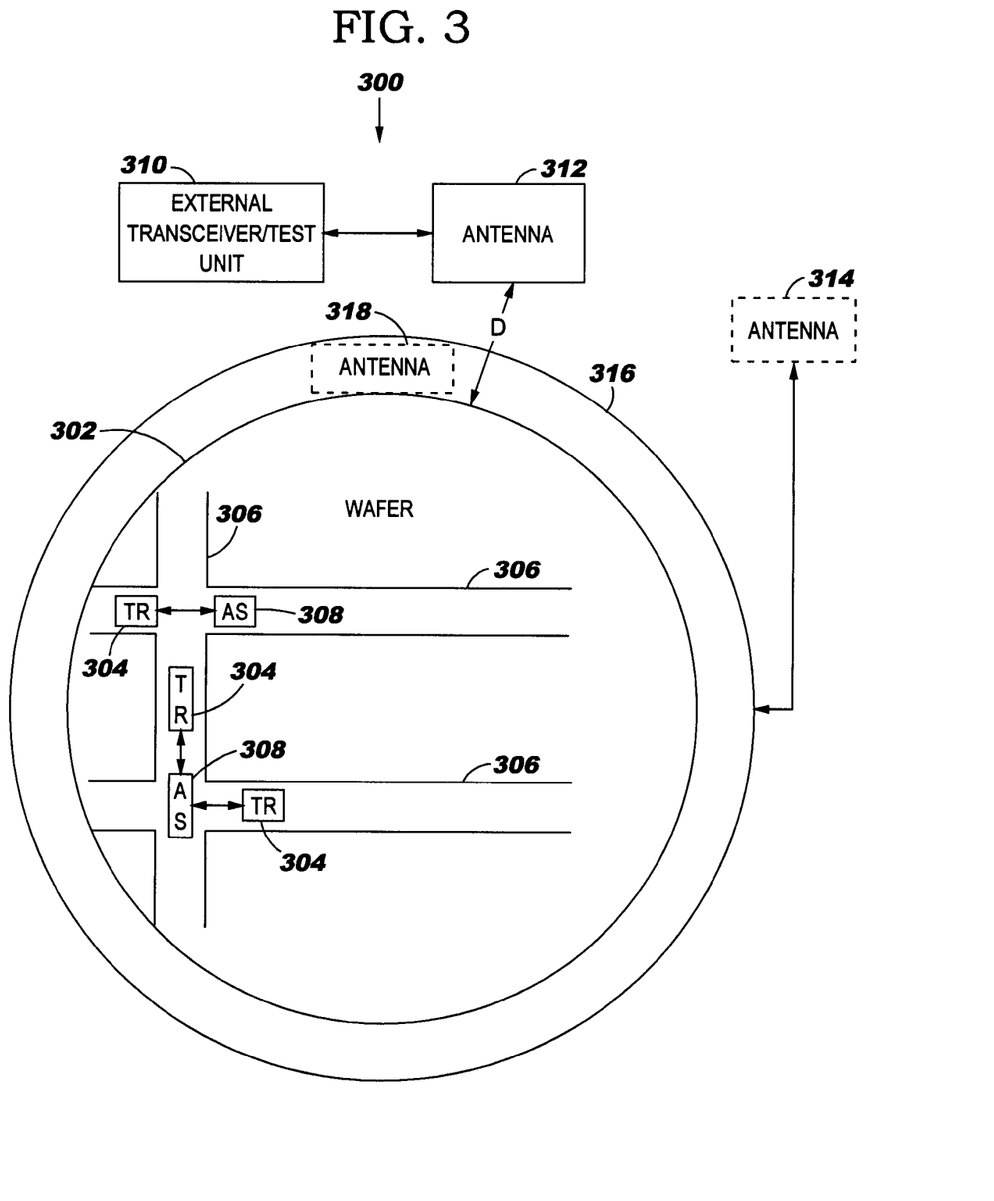
FIG. 3 is a block schematic diagram of a system to test integrated circuits or the like formed on a wafer in accordance with another embodiment of the present invention.

FIG. 3 is a block schematic diagram of a system 300 to test integrated circuits formed on a wafer 302, similar to integrated circuits 102 and 202 of FIGS. 1 and 2. The system 300 may be similar to the system 200 of FIG. 2. The system 300 may include a plurality of transceivers 304. Each of the transceivers 304 may be adapted to receive and transmit signals to test selected ones of a multiplicity of integrated circuits (not shown in FIG. 3), similar to integrated circuits 102 and 202 of FIGS. 1 and 2 respectively. Each of the transceivers 304 may be formed at a different location on the wafer 302 in at least one of a plurality of scribe lines 306 formed in the wafer 302. Each of the transceivers 304 may be coupled to one or more integrated circuits to test selected ones of the integrated circuits. A multiplexing circuit, similar to the multiplexing circuit 212 shown in FIG. 2 may be provided to couple each transceiver 304 to associated ones of the plurality of integrated circuits.

The system 300 may also include a plurality of antenna systems 308. Each antenna system 308 may be coupled to at least one of the plurality of transceivers 304. Each antenna system 308 may also be formed at different locations on the wafer 302 in one or more of the scribe lines 306. The transceivers 304, antenna systems 308 and scribe lines 306 are not shown to scale relative to the wafer 302 and are illustrated as being much larger than actuality for purposes of explaining the present invention. As previously described, the scribe lines may be on the order of about 200 microns or more in width. Each of the transceivers 304 and antenna systems 308 may be formed in a predetermined distribution on the wafer 302. The predetermined distribution may be adapted to effectively and efficiently test all integrated circuits at various stages of the manufacturing process and to facilitate optimum testing of a selected number of integrated circuits simultaneously. The predetermined distribution may also be adapted to minimize space utilization and to minimize electromagnetic interference with the integrated circuits during testing and between different transceivers 304 and associated antenna systems 308. Each transceiver 304 or each transceiver in a subset of transceivers 304 of the plurality of transceivers may each be adapted to receive testing signals and to transmit test result signals simultaneously on different radio frequencies or channels. As previously discussed, each of the transceivers 304 may be adapted to provide one of an amplitude shift keying (ASK) modulation, on-off keying (OOK) modulation or a similar modulation scheme. Each of the transceivers 304 may also be adapted to receive and transmit signals to perform real-time tests or other operations periodically during fabrication of the wafer 302. For example, the transceiver 304 may be adapted to transmit and receive signals to perform tests under burn-in stress conditions or other environmental conditions.

The system 300 may also include another transceiver or a system transceiver and test unit 310 that may be located external to the wafer 302. The system transceiver 310 may be adapted to transmit scan test vectors or other signals to selected ones of the transceivers 304 on the wafer 302 and to receive test results from the selected transceivers 304. Each of the transceivers 304 may communicate with the system transceiver 310 on different radio frequencies or channels. The transceivers 304 may transmit self-test data and receive and transmit scan test vectors form the external system transceiver and test unit 310. The system transceiver 310 may transmit and receive RF signals via an antenna 312. To minimize interference with other systems, the transmit power from the wafer 302 as well as the external transceiver 310 and antenna 312 may be kept at a low enough level so that the coverage is within a predetermined distance "D." The predetermined distance "D" may be on the order of about one meter.

In accordance with another embodiment of the present invention, one or more antennas 314 or an antenna system provided external to the wafer 302 may be coupleable to each of the transceivers 304. The transceivers 304 may be coupled to the antenna 314 via a wafer boat 316, wafer handler or other fixtures that may hold the wafer 302 during the manufacturing process. The transceivers 304 may transmit and receive signals via the antenna 314 to test the integrated circuits formed on the wafer 302 or for other purposes. In accordance with a further embodiment of the present invention an antenna 318 may be integrally formed or attached to the wafer boat 316 as an alternative to external antenna 314. The external antenna 314 or the wafer boat antenna 318 may be provided in addition to the antenna systems 308 formed in the scribe lines 306 or as alternatives to the antenna systems 308.

Figure 4:
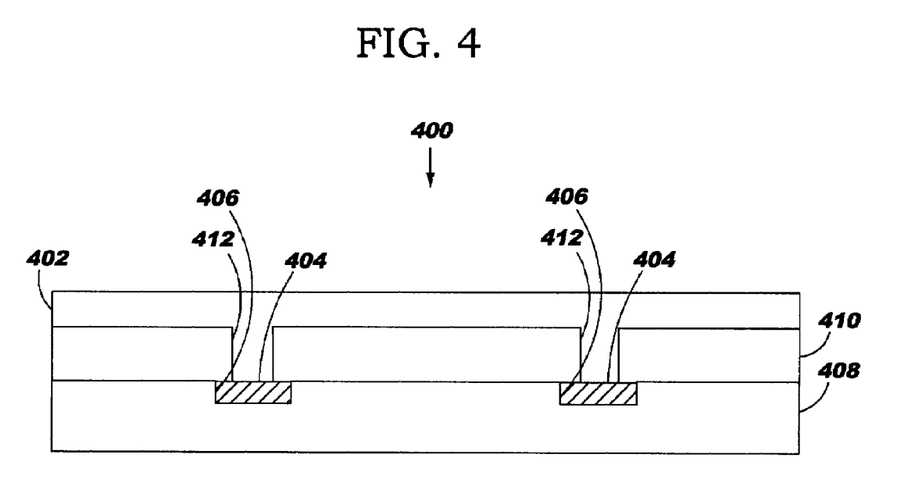
FIG. 4 is a partial cross-sectional view of a wafer illustrating a conductive layer to connect to transceivers formed on the wafer in accordance with an embodiment of the present invention.

FIG. 4 is a partial cross-sectional view of a wafer 400 illustrating a conductive layer 402 to connect to transceivers 404 formed in scribe lines 406 on the wafer 400 in accordance with an embodiment of the present invention. As previously described, the transceivers 404, similar to the transceivers 206 and 304 of FIGS. 2 and 3, respectively, may be formed in the scribe lines 406 that are formed in a substrate 408 of the wafer 400. Integrated circuits (not shown in FIG. 4) formed on the wafer 400 may be tested during the manufacturing process by depositing or forming a layer 410 of dielectric or insulation material on the substrate 408. Openings 412 or vias may be formed in the dielectric layer 410 to permit access and electrical connection to the underlying transceivers 404. The openings 412 may be formed by selectively removing material using standard photolithographic techniques or other known etching techniques. A layer 402 of conductive material or metallization may be deposited or formed on the dielectric layer 410 and in the openings 412 to contact the transceivers 404. The conductive material layer 402 may couple the transceiver 404 to test output points or other contact points.

The conductive material layer 402 may be etched to form conductive line traces to connect the individual transceivers 404 to test output points, contacts or pads, similar to pad 220 of FIG. 2, to receive test output signals or other signals from each of the transceivers 404. The test output points or pads may be formed proximate to a periphery of the wafer 400 to permit coupling to external test equipment to receive the test signals. After testing the integrated circuits, the conductive layer 402 and insulative layer 410 may be removed for further manufacturing or processing of the wafer 400. A conductive layer, similar to layer 402 or conductive line traces may be formed, as described above, at various stages of the manufacturing process to test the integrated circuits at various stages of completion or for other purposes. Test data may be sent to the transceivers 404 wirelessly and then the test results read out via line traces of the conductive layer 402.

Figure 5:
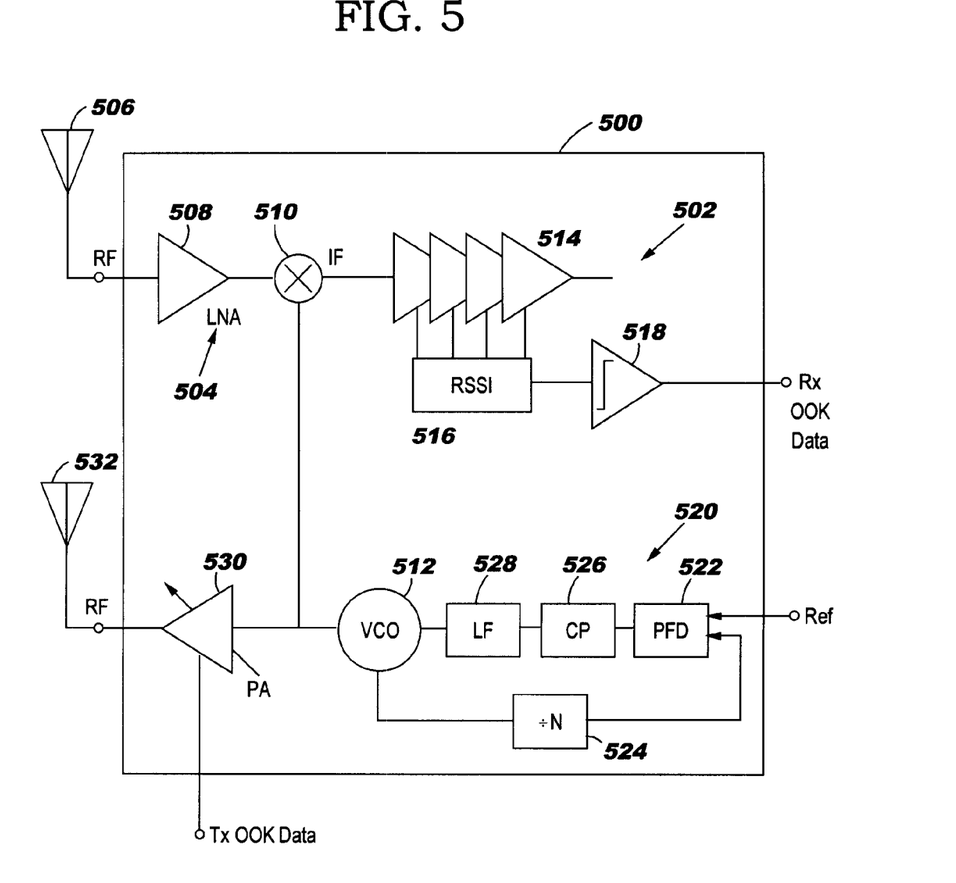
FIG. 5 is a block diagram of an example of a transceiver that may be used in a system to test integrated circuits or the like in accordance with an embodiment of the present invention.

FIG. 5 is a block diagram of an example of a transceiver 500 that may be use in a system, such as the system 200 of FIG. 2 or 300 of FIG. 3 to test integrated circuits or the like in accordance with an embodiment of the present invention. In a receiver section 502 of the transceiver 500, the transceiver 500 may include a down converter 504 to convert a received radio frequency (RF) signal from an antenna 506 to an intermediate frequency (IF) signal. The down converter 502 may include an amplifier 508, such as a low noise amplifier or the like, and a multiplexer 510. The multiplexer 510 may mix the RF signal from the amplifier 508 with a carrier signal from a voltage controlled oscillator (VCO) 512 to provide the IF signal. A limiting amplifier 514 may amplify the IF signal in response to inputs from a received signal strength indicator (RSSI) 516. A comparator 518 may generate a data signal in response to the amplified IF signal from the limiting amplifier 514 or RSSI 516. The data signal or received signal (Rx) from the comparator 518 may be an on-off keying (OOK) data signal or the like.

In a transmitter section 520 of the transceiver 500, the transceiver may include a phase/frequency detector (PFD) 522. The PFD 522 may receive a reference signal (Ref) or input signal and a carrier signal from the VCO 512 divided by a predetermined integer in a divide unit 524. A charge pump (CP) 426 may receive an output signal from the PFD 522. A filter 528 may filter selected frequency band signals from the charge pump 526. The filter 528 may be a low pass filter or the like. The VCO 512 may receive the signal from the filter 528. A power amplifier 530 may modulate a carrier signal from the VCO 512 by a data input or transmit signal (Tx) to provide an RF output signal that may be transmitted by an antenna 532. The transmit modulation signal Tx may be an on-off keying (OOK) modulating signal or the like.

Figure 6:
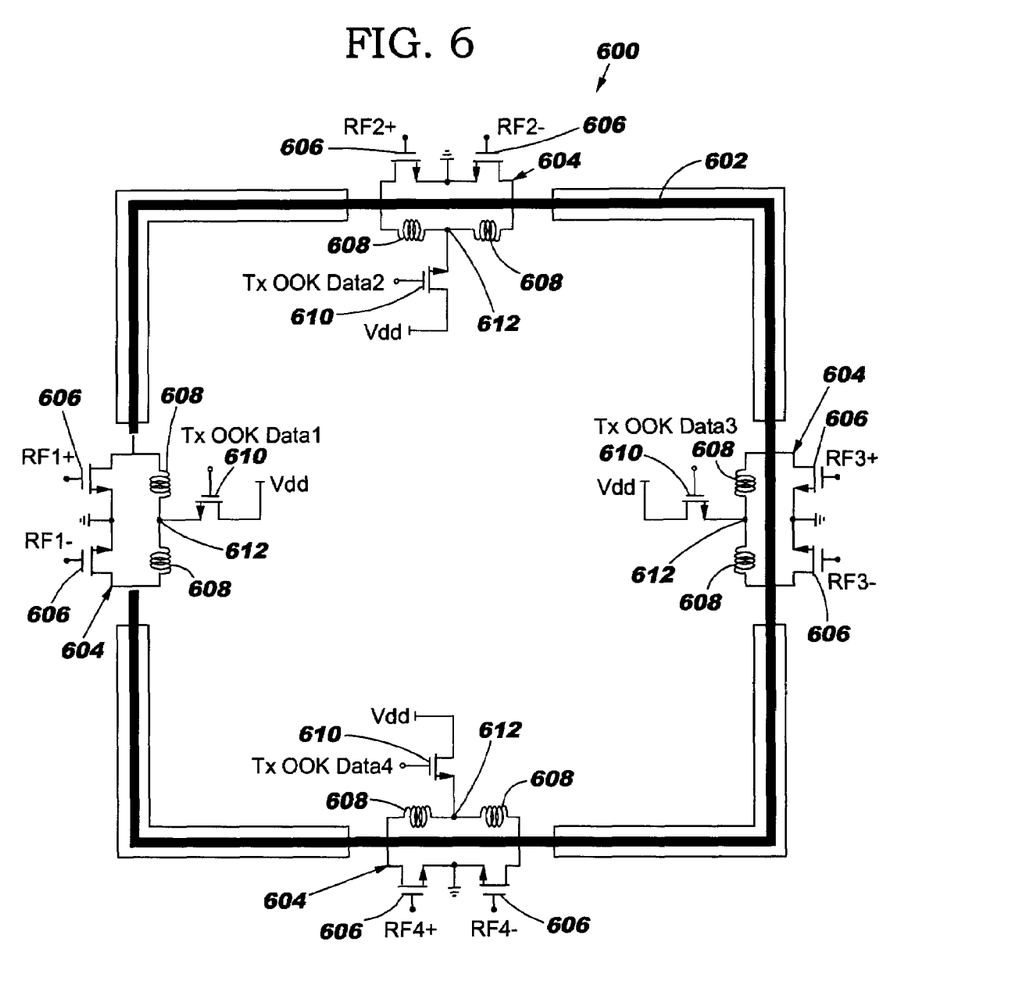
FIG. 6 is a schematic diagram of an example of an antenna system that may be used in a system to test integrated circuits or the like in accordance with an embodiment of the present invention.

FIG. 6 is a schematic diagram of an example of an antenna system 600 that may be used in a system, such as system 200 of FIG. 2 and system 300 of FIG. 3 to test integrated circuits or the like in accordance with an embodiment of the present invention. The antenna system 600 may be used for the antenna system 210 in FIG. 2 or the antenna system 308 in FIG. 3. The antenna system 600 may include a loop antenna 602 adapted to be shared by a plurality of transceivers (not shown in FIG. 6), such as transceiver 500 of FIG. 5 or a similar transceiver. The antenna system 600 may also include a plurality of differential amplifier circuits 604. The differential amplifier circuits 604 may include a pair of metal oxide semiconductor field effect transistors (MOSFETs) 606 or similar devices connected in a differential arrangement. The MOSFETs 606 may be either PNP or NPN transistors depending upon the polarity or whether a high or low voltage or signal is intended to be used to turn the transistors on or activate the transistors. Each differential amplifier circuit 604 may be associated with one of the plurality of transceivers. In operation, only one of the plurality of differential amplifier circuits is intended to be active at any given time to permit the associated transceiver to receive or transmit signals.

The antenna system 600 may further include an inductor or a pair of inductors 608 associated with each differential amplifier 604 and that may be connected in parallel therewith. The inductor or pair of inductors 608 may complete the loop antenna 602 when an associated differential amplifier 604 is inactive or disabled by putting a proper voltage or signal on a gate of each MOSFET 606 to render the MOSFET inactive or non-conductive. Another MOSFET 610 may couple a voltage source, Vdd, to a node 612 between each pair of inductors 608. The voltage source, Vdd, may be coupled to the node 612 in response to an RF carrier signal or data signal from an associated one of the plurality of transceivers, such as transceiver 500 (FIG. 5), being applied to a gate of the MOSFET 610 to activate the MOSFET 610. The differential amplifiers 604 associated with the active MOSFET 610 may also have an RF signal applied to their gates at the same time to cause the differential amplifier 610 to conduct and connect the antenna system 600 to ground potential. All other differential amplifiers 610 associated with non-transmitting or non-receiving transceivers will be inactive or non-conducting and the antenna loop 602 will be completed through the inductors 608 in parallel with the inactive differential amplifiers 604.

The antenna system 600 may be formed in the scribe lines, similar to the scribe lines 104 of FIG. 1, 208 of FIGS. 2 and 306 of FIG. 3. The loop antenna 602 may extend around one or more integrated circuits defined by the scribe lines. The loop antenna 602 may be physically small compared to the wavelength at which the antenna 602 may operate. The antenna system 600 may be designed or sized to operate in the 24 Gigahertz (GHz) ISM band. At around 24 GHz, line of sight transmission may be used to establish wireless communications and thereby avoid interference among other testing units or systems in the vicinity. Additionally, because wavelength is inversely proportional to the frequency, operating at about 24 GHz will significantly reduce the size of the required antennas and thereby make them more suitable for integration on a wafer. Moreover, passive components used in a 24 GHz radio transceiver will have lower inductance and capacitance and therefore occupy less chip area and more easily fit within the scribe lines.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

The invention claimed is:

1. A system to test integrated circuits on a wafer, comprising:
   a transceiver formed on the wafer, wherein the transceiver is formed in one of a scribe line formed in the wafer or on an otherwise unusable portion of the wafer to permit testing of the integrated circuits during various stages of a manufacturing process and before separation of the individual integrated circuits and to avoid using any area of the wafer useable to form an integrated circuit; and an antenna system couplable to the transceiver.

2. The system of claim 1, wherein the transceiver is able to couple to a plurality of integrated circuits formed on the wafer to test selected ones of the plurality of integrated circuits.

3. The system of claim 2, wherein the transceiver is adapted to apply test signals to at least one selected integrated circuit of the plurality of integrated circuits to test the at least one selected integrated circuit in response to the antenna system receiving a signal.

4. The system of claim 2, wherein the antenna system is adapted to transmit signals corresponding to results from testing at least one selected integrated circuit of the plurality of integrated circuits.

5. The system of claim 2, further comprising a multiplexing circuit to couple the transceiver to each of the plurality of integrated circuits.

6. The system of claim 1, wherein the antenna system comprises one of a loop antenna, a pair of dipole antennas or an antenna array formed by loop or dipole antenna elements.

7. The system of claim 1, further comprising:
a plurality of transceivers, each adapted to receive and transmit signals to test selected ones of a multiplicity of integrated circuits formed on the wafer and each of the transceivers being formed at a different location on the wafer; and
a plurality of antenna systems, each antenna system being coupleable to at least one of the plurality of transceivers and each of the plurality of antenna systems being formed at different locations on the wafer.

8. The system of claim 7, wherein each transceiver of the plurality of transceivers or each transceiver in a subset of transceivers of the plurality of transceivers are each adapted to transmit test result signals simultaneously on different radio frequencies.

9. The system of claim 7, wherein each of the antenna systems is formed to minimize electromagnetic interference with the multiplicity of integrated circuits during testing.

10. The system of claim 7, wherein each of the transceivers and antenna systems are formed in a predetermined distribution on the wafer.

11. The system of claim 10, wherein the predetermined distribution is adapted to minimize space utilization, facilitate optimum testing of a selected number of integrated circuits simultaneously, and to minimize electromagnetic interference with the integrated circuits during testing and between different transceivers and associated antenna systems.

12. The system of claim 7, further comprising a multiplexing circuit, wherein an integrated circuit to be tested and an associated transceiver are selectable by at least one of a word-line or a bit-line and wherein the transceiver is adapted to select a proper stream of test data of the integrated circuit under test from the multiplexing circuit.

13. The system of claim 7, further comprising a word-line/bit-line power distribution scheme adapted to select an integrated circuit to be tested and an associated transceiver and to distribute test mode power to the selected integrated circuit to be tested and the associated transceiver.

14. The system of claim 1, wherein the transceiver receives power via one of a probe, a radio frequency power signal, a word-line or a bit-line, and a pad electrically connectable to the transceiver, wherein the pad is connectable to an external power source.

15. The system of claim 1, further comprising a pad formed proximate to a periphery of the wafer and electrically connectable to the transceiver to provide power to the transceiver.

16. The system of claim 1, further comprising another transceiver and test unit external to the wafer and adapted to transmit scan test vectors to the transceiver on the wafer and to receive test results from the transceiver on the wafer.

17. The system of claim 16, wherein the transceiver is adapted to transmit self-test data and to receive and transmit scan test vectors from the external transceiver and test unit.

18. The system of claim 1, wherein the transceiver is adapted to provide one of an amplitude shift keying (ASK) or an on-off keying (OOK) modulation scheme.

19. The system of claim 1, wherein the transceiver is adapted to receive and to transmit signals to perform real-time tests periodically during fabrication of the wafer.

20. The system of claim 1, wherein the transceiver is adapted to receive and to transmit signals to perform tests under burn-in stress conditions or other environmental extremes.

21. The system of claim 1, wherein the transceiver comprises:
a down converter to convert a received radio frequency (RF) signal to an intermediate frequency (IF) signal;
a received signal strength indicator (RSSI);
a limiting amplifier to amplify the IF signal in response to the RSSI; and
a comparator to generate a data signal in response to the amplified IF signal.

22. The system of claim 1, wherein the transceiver comprises:
a phase/frequency detector to receive an input or reference signal;
a charge pump to receive an output signal from the phase/frequency detector;
a filter to filter selected frequency band signals from a charge pump signal;
a voltage controlled oscillator to receive a filtered signal from the filter; and
a power amplifier to modulate a carrier signal from the voltage controlled oscillator by a data input signal.

23. The system of claim 1, wherein the antenna system comprises an antenna system formed in at least one of a same scribe line as the transceiver, in at least one other scribe line formed in the wafer, on a chip on the wafer not used to form an integrated circuit or on an usable portion of the wafer.

24. The system of claim 23, wherein the antenna system comprises:
a loop antenna adapted to be shared by a plurality of transceivers; and
a plurality of differential amplifier circuits, each differential amplifier circuit being associated with one of the plurality of transceivers, wherein only one of the plurality of differential amplifier circuits is active at any given time to permit the associated transceiver to receive or transmit signals.

25. The system of claim 23, wherein the antenna system further comprises an inductor connected in parallel with each differential amplifier circuit, wherein the inductor completes the loop antenna when an associated differential amplifier circuit is disabled.

26. The system of claim 23, wherein the antenna system further comprises:

a pair of inductors connected in parallel with each differential amplifier circuit, wherein the pair of inductors complete the loop antenna when an associated differential amplifier circuit is disabled; and a field effect transistor (FET) to couple a voltage source to a node between each pair of inductors, wherein the voltage source is connected to the node in response to an RF carrier signal from an associated one of the plurality of transceivers being applied to a gate of the FET.

27. The system of claim 1, wherein the antenna system comprises an antenna external to the wafer and wherein the transceiver is connectable to the antenna by a wafer boat or fixture.

28. The system of claim 1, further comprising:
an insulative layer formed on the wafer; and
a conductive layer formed on the insulative layer and electrically connecting to the transceiver via an opening formed in the insulative layer to test selected ones of the integrated circuits during manufacturing, wherein the insulative layer and the conductive layer are removable for further fabrication of the integrated circuits.

29. A system to test integrated circuits on a wafer, comprising:
a plurality of transceivers each adapted to receive and transmit signals to test selected ones of a multiplicity of integrated circuits formed on the wafer and each of the transceivers being formed at a different location on the wafer in one of a plurality of scribe lines formed in the wafer or at other otherwise unusable locations on the wafer to permit testing of the integrated circuits during various stages of a manufacturing process and before separation of the individual integrated circuits and to avoid using any area of the wafer useable to form integrated circuits; and
at least one antenna systems couplable to the plurality of transceivers.

30. The system of claim 29, further comprising a multiplexing circuit to couple each transceiver selectively to one of a predetermined number of the multiplicity of integrated circuits.

31. The system of claim 29, wherein each transceiver of the plurality of transceivers or each transceiver in a subset of transceivers of the plurality of transceivers are each adapted to transmit signals corresponding to test results simultaneously on different radio frequencies.

32. The system of claim 29, wherein each of the transceivers and associated antenna systems are formed in a predetermined distribution on the wafer.

33. The system of claim 29, further comprising a word-line/bit-line distribution scheme adapted to select each integrated circuit to be tested and an associated transceiver.

34. The system of claim 29, wherein each transceiver is powered via one of a probe, a radio frequency power signal, a word-line/bit-line power distribution scheme and a pad electrically connectable to the transceiver, wherein the pad is connectable to an external power source.

35. The system of claim 29, wherein each transceiver comprises:
a down converter to convert a received radio frequency (RF) signal to an intermediate signal (IF);
a received signal strength indicator (RSSI);
an amplifier to amplify the IF signal in response to the RSSI; and
a comparator to generate a data signal in response to the amplified IF signal.

36. The system of claim 29, wherein each transceiver comprises:
a phase/frequency detector to receive an input or reference signal;
a charge pump to receive an output signal from the phase/frequency detector;
a filter to filter signals in a selected frequency band from the charge pump;
a voltage controlled oscillator to receive a filtered signal from the filter; and
a power amplifier to modulate a carrier signal from the voltage controlled oscillator by a data signal.

37. The system of claim 29, wherein the at least one antenna system comprises an antenna external to the wafer and wherein each of the plurality of transceivers is connectable to the antenna by a wafer boat or fixture.

38. The system of claim 29, further comprising a plurality of antenna systems, each antenna system being coupleable to at least one of the plurality of transceivers and each of the plurality of antenna systems being formed at different locations on the wafer in at least one of the plurality of scribe lines.

39. The system of claim 38, wherein each antenna system comprises one of a loop antenna, a pair of dipole antennas or an antenna array formed by loop or dipole antenna elements.

40. The system of claim 38, wherein each antenna system comprises:
a loop antenna adapted to be shared by a predetermined number of the plurality of transceivers; and
a plurality of differential amplifiers, each differential amplifier being associated with one of the predetermined number of transceivers, wherein only one of the plurality of differential amplifiers is active at any given time to permit the associated transceiver to receive or transmit signals.

41. The system of claim 29, further comprising:
an insulative layer formed on the wafer; and
a conductive layer formed on the insulative layer in line traces electrically connecting to each of the plurality of transceivers via openings formed in the insulative layer to test selected ones of the integrated circuits during manufacturing, wherein the insulative layer and the conductive layer are removable for further fabrication of the integrated circuits.

42. A method of making a system to test integrated circuits on a wafer, comprising:
forming a transceiver on the wafer, wherein the transceiver is formed in one of a scribe line formed in the wafer or on an otherwise unusable portion of the wafer to permit testing of the integrated circuits during various stages of a manufacturing process and before separation of the individual integrated circuits and to avoid using any area of the wafer useable to form an integrated circuit; and
providing an antenna system couplable to the transceiver.

43. The method of claim 42, further comprising forming a multiplexing circuit to couple the transceiver to each of a plurality of integrated circuits.

44. The method of claim 42, further comprising:
forming a plurality of transceivers, each adapted to receive and transmit signals to test selected ones of a multiplicity of integrated circuits formed on the wafer and each of the transceivers being formed at different location on the wafer in one of a plurality of scribe lines formed in the wafer; and forming a plurality of antenna systems, each antenna system being coupleable to at least one of a plurality of transceivers and each of the plurality of antennas systems being formed at different locations on the wafer in at least one of a plurality of scribe lines.

45. The method of claim 44, further comprising forming each of the transceivers and associated antenna systems in a predetermined distribution on the wafer.

46. The method of claim 44, wherein forming each transceiver comprises:
   forming a down converter to convert a received radio frequency (RF) signal to an intermediate (IF) signal;
   forming a received signal strength indicator (RSSI);
   forming an amplifier to amplify the IF signal in response to the RSSI; and
   forming a comparator to generate a data signal in response to the amplified IF signal.

47. The method of claim 44, wherein forming each transceiver comprises:
   forming a phase/frequency detector to receive an input or reference signal;
   forming a charge pump to receive an output signal from the phase/frequency detector;
   forming a filter to filter signals in a selected frequency band from the charge pump;
   forming a voltage controlled oscillator to receive a filtered signal from the filter; and
   forming a power amplifier to modulate a carrier signal from the voltage controlled oscillator by a data signal.

48. The method of claim 44, wherein forming each antenna system comprises forming one of a loop antenna, a pair of dipole antennas or an antenna array formed by loop or dipole antenna elements.

49. The method of claim 44, wherein forming each antenna system comprises:
   forming a loop antenna adapted to be shared by a predetermined number of the plurality of transceivers; and
   forming a plurality of differential amplifier circuits, each differential amplifier circuit being associated with one of the predetermined number of transceivers, wherein only one of the plurality of differential amplifier circuits is active at any given time to permit the associated transceiver to receive or transmit signals.

50. A method to test integrated circuits on a wafer, comprising:
   selecting at least one integrated circuit of a plurality of integrated circuits to be tested;
   performing a test or self-test on the at least one selected integrated circuit in response to selecting the at least one integrated circuit; and
   transmitting test results via a transceiver associated with the at least one selected integrated circuit, wherein the transceiver is formed on the wafer in one of a scribe line formed in the wafer or on an otherwise unusable portion of the wafer to permit testing of the integrated circuits during various stages of a manufacturing process and before separation of the individual integrated circuits and to avoid using any area of the wafer useable to form one of the plurality of integrated circuits.

51. The method of claim 50, wherein selecting the at least one integrated circuit comprises using a word-line/bit-line distribution.

52. The method of claim 50, further comprising transmitting test results of the at least one selected integrated circuit to an external transceiver.

53. The method of claim 50, wherein transmitting the test results comprises transmitting in one of an amplitude shift keying (ASK) or an on-off keying (OOK) modulation scheme.

54. The method of claim 50, further comprising applying power to the at least one selected integrated circuit via one of a probe, radio frequency power signal, a pad electrically connectable to an external power source, a word-line or a bit-line.

55. The method of claim 50, further comprising applying power to the transceiver associated with the at least one selected integrated circuit via one of a probe, radio frequency power signal, a pad electrically connectable to an external power source, a word-line or a bit-line.

56. The method of claim 50, further comprising receiving and transmitting signals to perform real-time tests of the at least one selected integrated circuit during at least one of fabrication and burn-in of the wafer.

57. The method of claim 50, further comprising transmitting an RF signal to a transceiver associated with the at least one selected integrated circuit to test the integrated circuit.

58. The method of claim 50, further comprising:
   forming an insulative layer on the wafer; and
   forming a conductive layer on the insulative layer in line traces electrically connecting to each of a plurality of transceivers via openings formed in the insulative layer to test selected ones of the integrated circuits during manufacturing; and
   removing the insulative layer and the conductive layer for further fabrication of the integrated circuits.

* * * * *